United States Patent [19]

Nagashima et al.

[11] Patent Number: 4,825,539
[45] Date of Patent: May 2, 1989

[54] PROCESS FOR MANUFACTURING A MULTILAYER SUBSTRATE

[75] Inventors: Kanji Nagashima, Kawasaki; Yuji Yamada, Sagamihara; Toshihiro Kusagaya, Kawasaki, all of Japan

[73] Assignee: Fujitsu Limited, Kawasaki, Japan

[21] Appl. No.: 174,347

[22] Filed: Mar. 28, 1988

[30] Foreign Application Priority Data

Mar. 27, 1987 [JP] Japan ................... 62-075040

[51] Int. Cl.⁴ .................................... H01K 3/22
[52] U.S. Cl. ........................... 29/848; 29/830; 156/89; 174/68.5; 264/61
[58] Field of Search ........... 264/61; 156/89; 29/830, 29/831, 848; 174/68.5

[56] References Cited

U.S. PATENT DOCUMENTS

| | | | |
|---|---|---|---|
| 3,770,529 | 11/1973 | Anderson | 174/68.5 X |
| 3,844,831 | 10/1974 | Cass et al. | 174/68.5 X |
| 3,852,877 | 12/1974 | Ahn et al. | 29/830 |
| 3,922,777 | 12/1975 | Weitze et al. | 174/68.5 X |
| 4,009,238 | 2/1977 | Niedermeier et al. | 264/61 |
| 4,109,377 | 8/1978 | Blazick et al. | 29/831 |
| 4,250,616 | 2/1981 | Klimek et al. | 29/830 |
| 4,586,972 | 5/1986 | Yokotani et al. | 156/89 |
| 4,677,254 | 6/1987 | Boss et al. | 174/68.5 |
| 4,749,421 | 6/1988 | Matsui et al. | 264/61 X |
| 4,753,694 | 6/1988 | Herron et al. | 156/89 |
| 4,766,671 | 8/1988 | Utsumi et al. | 174/68.5 |

FOREIGN PATENT DOCUMENTS 53-71269 6/1978 Japan ..................... 29/830

*Primary Examiner*—Carl J. Arbes
*Attorney, Agent, or Firm*—Staas & Halsey

[57] ABSTRACT

Green sheets can be laminated without destroying the cross-sectional shape of a metallization pattern printed on a green sheet by burying the pattern in the green sheet while freezing the pattern and heating the green sheet until the green sheet containing the pattern has a flat top surface. Accordingly, the pattern is buried in the green sheet and the shape of the pattern is preserved. When laminated and pressed, the pattern is not damaged since it has been buried in the green sheet.

16 Claims, 2 Drawing Sheets

PROCESS FOR MANUFACTURING A MULTILAYER SUBSTRATE

BACKGROUND OF THE INVENTION

1. Field of the Invention

The present invention relates to a process for laminating green sheets. More specifically, the present invention relates to a process for manufacturing a multilayer substrate, in which a width of a metallization pattern is reduced.

2. Description of the Related Art

A greater densification of the packaging of an electric circuit is required in many fields, a shortening of the length of interconnections and making patterns of a circuit substrate more fine are now essential in the computer field, etc. Since the density of interconnections of a thick film circuit substrate is limited because of the use of a screen printing method, a multilayer substrate made from green sheets is under consideration. In the manufacture of a multilayer substrate, a plurality of green sheets on which a metallization pattern is printed are laminated, pressed under heat, and fired.

In the prior art, when a plurality of green sheets are heat pressed, the printed patterns are pushed onto the green sheets and caused to spread transversely. As a result, after firing, the metallization patterns have a cross section of a thin ellipse and it becomes difficult to make these patterns finer while maintaining a low electrical resistance.

SUMMARY OF THE INVENTION

An object of the present invention is to solve the above problems and to provide a process for laminating green sheets while maintaining a fine metallization pattern, as printed, during lamination by pressing.

The above object of the present invention is realized by a process for laminating a green sheet on a metallized green sheet, comprising the steps of preparing a first green sheet, printing a metallization pattern on the first green sheet, burying the metallization pattern in the first green sheet while freezing the metallization pattern so that a top surface of the first green sheet is made flat and a cross-sectional shape of the metallization pattern is substantially preserved after burying. In addition, a second green sheet is superposed on the first green sheet on a side in which the metallization pattern is buried.

In the present invention, a metallization pattern formed on a green sheet by printing is pushed into the green sheet, while the metallization pattern is frozen. Preferably the green sheet is heated until the metallization pattern is buried in the green sheet and a top surface of the green sheet containing the metallization pattern is made flat. In this burying process, the cross-sectional shape of the metallization pattern is not substantially changed due to the freezing of the pattern. In this specification, the cross-sectional shape of a metallization pattern is particularly concerned with a width of the pattern. As a result, the pattern is still fine. Further, when such green sheets having a metallization pattern buried therein are laminated and pressed, the metallization pattern is not deformed because the green sheets have a flat top surface and the metallization pattern has been buried in the green sheet. Thus, a multilayer stack of green sheets having a fine pattern can be obtained.

DESCRIPTION OF THE PREFERRED EMBODIMENTS

Figure 1A:
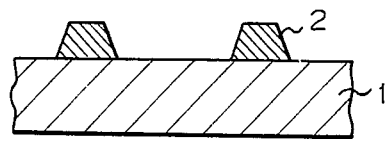
FIGS. 1A to 1D are sectional views of a green sheet or laminated green sheet during main steps of a process according to the present invention.

Referring to FIG. 1A, a green sheet 1 is prepared from alumina having an average particle size of 4-5 μm; casting to form a sheet having a thickness of 0.2-1 mm is casted by a doctor blade method. The method includes cutting the sheet, punching to form through holes, drying the sheet at room temperature, and filling the through holes with a metal paste such as tungsten paste. Then, a pattern 2 of tungsten is screen-printed onto the green sheet 1. The tungsten pattern 2 has a width of 100 μm and a thickness of 50 μm (T/W ratio, i.e., thickness/width ratio of 0.5).

Figure 1B:
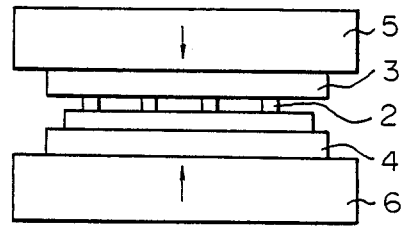

Referring to FIG. 1B, the printed green sheet 1 is placed in a press. The press comprises a hot plate 4 of steel thermostated to a temperature of 40° C. to 90° C. and a cold plate 3 of steel cooled to a temperature of minus 100° C. by immersion in liquid nitrogen. The printed green sheet 1 is placed on the hot plate 4 which is set on a lower press 6 to soften the green sheet. The cold plate 3 is first immersed in the liquid nitrogen, then taken out and mounted to an upper press 5. After the cold press 3 is mounted on the upper press 5, the upper press 5 is soon driven downward to come into contact with the top surface of the tungsten pattern 2. The tungsten pattern 2 is immediately frozen by this contact with the cold plate 5. The upper press 5 is continuously driven downward to push the pattern 2 into the softened green sheet 1 until the top surface of the pattern 2 becomes even with the top surface of the green sheet 1. During this pressing, a thin top surface layer of the green sheet 1 may be forzen when the cold plate 3 is in contact with the tungsten pattern 2, but the main portion of the green sheet 1 remains unfrozen.

Figure 1C:
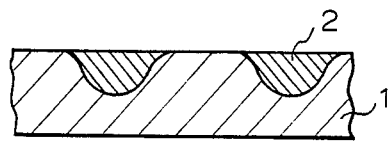

The resulting pressed green sheet 1 is illustrated in FIG. 1C. It can be seen that the tungsten pattern 2 is not substantially damaged during the burying process from the pattern as printed. The pattern has a thickness of 50 μm and a width of 100 μm i.e., T/W ratio of 0.5.

Although the cold plate 3 is cooled to −100° C. in the above case, the cold plate 3 may have a higher temperature as long as the pattern 2 is frozen. The cold plate 3 may be continuously cooled by a cooling mechanism.

Figure 1D:
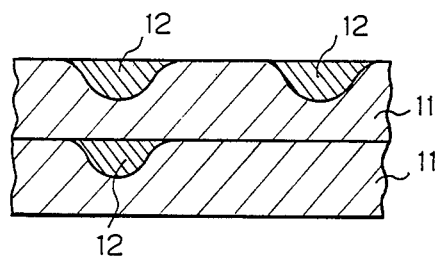

Referring to FIG. 1D, a plurality of green sheets 11 into which a tungsten pattern 12 is buried in the manner described above, are laminated by pressing. After this lamination or pressing, the tungsten pattern 2 suffers no damage at all and the cross-sectional shape of the pattern is preserved as buried or as printed.

Figure 2:
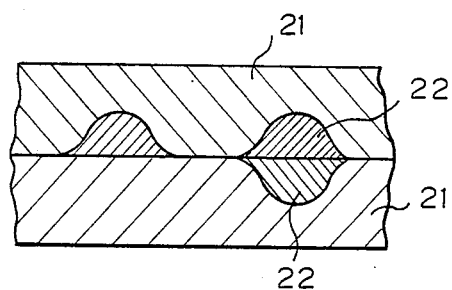
FIG. 2 is a sectional view of a laminated green sheet.

FIG. 2 is another lamination process of green sheets 21 in which two tungsten patterns 22 face each other and are in contact with each other.

In the above example, supersonic vibration can be advantageously applied while the press 5 is pushing the cold plate 3 to press the pattern 2 into the green sheet 1 from a time just after the cold plate 3 comes into contact with the pattern 2. The supersonic vibration and heating of the green sheet accelerates the burying of a pattern in the green sheet.

The green sheet may be any known green sheet including a green sheet of ceramics such as alumina, zirconia, etc., and glass ceramic. The metallization pattern may be made of any knwon metallization material including a metal paste such as a copper paste, a molybdenum paste, and a silver-palladium alloy paste.

The thus obtained laminate of green sheets may be heat treated by a known method and conditions to sinter the sheets to form a body of a multilayer substrate are applied. The details of the heat treatments are clear to a person skilled in the art and thus need not be mentioned here.

Figure 3:
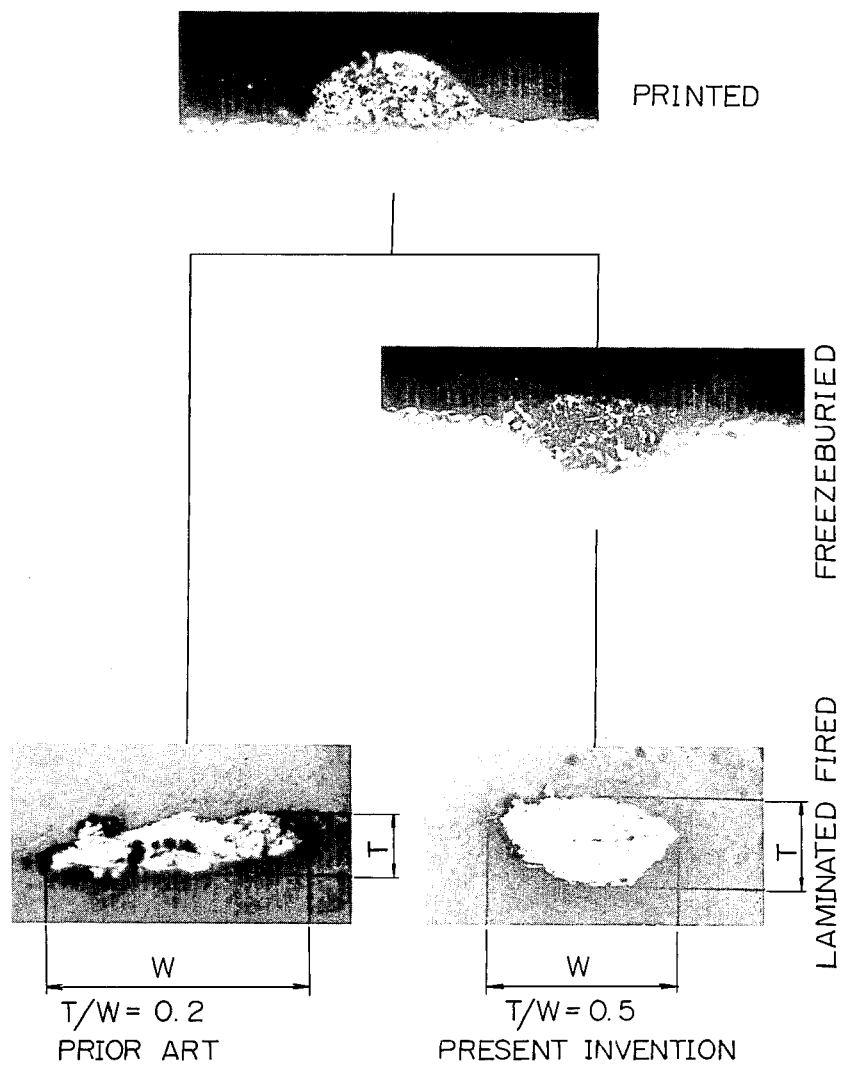
FIG. 3 is a cross section of a green sheet and a fired sheet prepared according to the present invention and the prior art.

FIG. 3 shows the results of the process according to the present invention compared with the prior art. The top photograph is a sectional view of a tungsten pattern printed on a green sheet by screen printing and the printed pattern has a maximum thickness of 50 μm and a width of 100 μm. The middle photograph is a sectional view of the pattern when buried in the green sheet according to a process of the present invention. The right bottom photograph is a sectional view of the pattern after firing, wherein the pattern has a thickness of 40 μm and, a width of 80 μm, i.e., T/W ratio of 0.5. The left bottom photograph is a section view of a pattern after firing, prepared from the same pattern as in the top photograph, in accordance with prior art, i.e., by directly laminating and pressing green sheets having pattern printed thereon. This pattern has a thickness of 20 μm and a width of 100 μm, i.e., T/W ratio of 0.2.

The many features and advantages of the invention are apparent from the detailed specification and thus, it is intended by the appended claims to cover all such features and advantages that fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to falling within the scope of the invention.

What is claimed is:

1. A process for laminating a green sheet on a metallized green sheet, said process comprising the steps of:
   (a) preparing a first green sheet;
   (b) printing a metallization pattern on the first green sheet;
   (c) burying the metallization pattern in the first green sheet while freezing the metallization pattern so that a top surface of the first green sheet is made flat and a cross-sectional shape of the metallization pattern is substantially preserved after burying; and
   (d) superposing a second green sheet on the first green sheet on a side in which the metallization pattern is buried.

2. A process according to claim 1, wherein said step (c) comprises the substep (i) of heating the first green sheet while the metallization pattern is frozen and buried in the first green sheet.

3. A process according to claim 2, wherein said substep (i) includes heating the first green sheet to a temperature of 40° to 90° C. while the metallization pattern is frozen and buried in the first green sheet.

4. A process according to claim 1, wherein said step (c) comprises the substep (i) of freezing the metallization pattern by placing a cold plate in contact with the metallization pattern.

5. A process according to claim 4, wherein substep (i) includes freezing the cold plate to a temperature lower than −100° C.

6. A process according to claim 1, wherein said step (a) includes forming the first green sheet of a ceramic.

7. A process according to claim 4, further comprising the substep of applying supersonic vibration to the cold plate while the cold plate is pushing the metallization pattern into the first green sheet.

8. A process for manufacturing a multilayer substrate, comprising the steps of:
   (a) preparing a plurality of metallized green sheets, including the steps of:
      (i) preparing a green sheet ;
      (ii) printing a metallization pattern on the green sheet; and
      (iii) burying the metallization pattern in the green sheet while freezing the metallization pattern so that a top surface of the first green sheet is made flat and a cross-sectional shape of the metallization pattern is substantially preserved after burying;
   (b) laminating the plurality of metallized green sheets; and
   (c) heat treating the laminate of the metallized green sheets to obtain a multilayer substrate.

9. A process according to claim 8, wherein said step iii) includes the substep of heating the green sheet while the metallization pattern is frozen and buried in the green sheet.

10. A process according to claim 9, wherein said substep iii) includes heating the green sheet to a temperature between 40° C. to 90° C.

11. A process according to claim 8, wherein said substep iii) further includes freezing the metallization pattern by placing a cold plate in contact with the metallization pattern.

12. A process according to claim 11, wherein said said substep iii) further includes lowering the temperature of the cold plate to a temperature lower than −100° C.

13. A process according to claim 8, wherein said substep iii) includes applying supersonic vibration to the cold plate while the cold plate is pushing the metallization pattern into the green sheet.

14. A process according to claim 13, wherein wherein said substep i) includes preparing a green sheet of a ceramic.

15. A process according to claim 8, wherein said step (c) includes the substeps of:
   (i) removing an organic binder from the green sheet by employing a first heat treatment; and
   (ii) sintering the green sheet by employing a second heat treatment.

16. A process according to claim 8, wherein said substep ii) includes printing a printed metallization pattern made of a metal paste.

* * * * *